United States Patent
Xu et al.

(10) Patent No.: US 9,759,843 B2
(45) Date of Patent: Sep. 12, 2017

(54) OPTICAL BEAM SHAPING AND POLARIZATION SELECTION ON LED WITH WAVELENGTH CONVERSION

(75) Inventors: Li Xu, Saratoga, CA (US); Bo Pi, Carlsbad, CA (US)

(73) Assignee: Axlen, Inc., Wilmington, DE (US)

( * ) Notice: Subject to any disclaimer, the term of this patent is extended or adjusted under 35 U.S.C. 154(b) by 0 days.

(21) Appl. No.: 13/807,269

(22) PCT Filed: Jun. 28, 2011

(86) PCT No.: PCT/US2011/042251
§ 371 (c)(1),
(2), (4) Date: Jun. 17, 2013

(87) PCT Pub. No.: WO2012/006123
PCT Pub. Date: Jan. 12, 2012

(65) Prior Publication Data
US 2013/0258634 A1    Oct. 3, 2013

Related U.S. Application Data

(60) Provisional application No. 61/398,510, filed on Jun. 28, 2010.

(51) Int. Cl.
*F21V 9/00* (2015.01)
*G02B 5/04* (2006.01)
(Continued)

(52) U.S. Cl.
CPC ........... *G02B 5/04* (2013.01); *F21V 9/00* (2013.01); *F21V 9/14* (2013.01); *G02B 5/0231* (2013.01); *G02B 5/0278* (2013.01)

(58) Field of Classification Search
CPC ............ F21S 10/02; F21S 9/14; G02B 6/0056
(Continued)

(56) References Cited

U.S. PATENT DOCUMENTS 5,813,752 A * 9/1998 Singer et al. ............... 362/293
6,786,617 B2 * 9/2004 Lemay ................... B60Q 3/044
257/E25.02

(Continued)

FOREIGN PATENT DOCUMENTS

KR    10-2007-0081969 A    8/2007
WO    2006/035388 A2    4/2006

OTHER PUBLICATIONS

International Search Report and Written Opinion mailed on Feb. 27, 2012 for International Application No. PCT/US2011/042251, filed Jun. 28, 2011 (8 pages).

*Primary Examiner* — Bryon T Gyllstrom
(74) *Attorney, Agent, or Firm* — Perkins Coie LLP

(57) ABSTRACT

Techniques, devices and materials for light source devices that convert excitation light into different light via wavelength conversion materials. One example of a light source includes an excitation light source; a wavelength conversion material that absorbs light from the excitation light source and emits a longer wavelength light; and a layer of a transparent material that has plural optical structures in contact to or in close proximity to the wavelength conversion material to receive the emitted light from the wavelength conversion material and to modify the received light to produce output light with a desired spatial pattern associated with the plural optical structures.

29 Claims, 26 Drawing Sheets

(51) Int. Cl.
  *G02B 5/02* (2006.01)
  *F21V 9/14* (2006.01)

(58) Field of Classification Search
  USPC ........ 362/259, 293, 19, 311.02, 296.01, 299, 362/300
  See application file for complete search history.

(56) References Cited

U.S. PATENT DOCUMENTS

| | | | | |
|---|---|---|---|---|
| 7,019,334 B2* | 3/2006 | Yatsuda | ............... | F21K 9/00 257/100 |
| 7,029,147 B2* | 4/2006 | Nawashiro | ............... | F21V 5/04 362/236 |
| 7,157,839 B2* | 1/2007 | Ouderkirk | ............... | H01L 33/46 257/98 |
| 7,282,748 B2* | 10/2007 | Takeda | ............... | F21S 48/1154 257/98 |
| 7,497,597 B2* | 3/2009 | Suehiro | ............... | H01L 33/56 257/100 |
| 7,556,404 B2* | 7/2009 | Nawashiro | ............... | F21V 5/04 257/98 |
| 7,630,134 B2* | 12/2009 | Takahashi et al. | ....... | 359/485.01 |
| 7,633,679 B2* | 12/2009 | Mi | ............... | 359/485.02 |
| 7,635,215 B2* | 12/2009 | Lee et al. | ............... | 362/607 |
| 7,651,243 B2* | 1/2010 | McGuire et al. | ............... | 362/293 |
| 7,717,589 B2* | 5/2010 | Nishioka | ............... | H01L 33/507 257/100 |
| 7,959,321 B2* | 6/2011 | Ryu | ............... | G02B 6/0068 257/98 |
| 8,251,528 B2* | 8/2012 | Kim | ............... | H01L 33/501 257/98 |
| 8,262,257 B2* | 9/2012 | Deeben | | |
| 2003/0007344 A1* | 1/2003 | Parker | ............... | 362/31 |
| 2004/0150997 A1* | 8/2004 | Ouderkirk et al. | ....... | 362/255 |
| 2005/0052859 A1* | 3/2005 | Lazarev et al. | ............... | 362/31 |
| 2007/0081360 A1* | 4/2007 | Bailey et al. | ............... | 362/621 |
| 2007/0268694 A1* | 11/2007 | Bailey | ............... | G02B 27/0955 362/231 |
| 2008/0030986 A1* | 2/2008 | Ogawa | ............... | H01L 25/0753 362/231 |
| 2009/0086508 A1* | 4/2009 | Bierhuizen | ............... | 362/617 |
| 2009/0262515 A1* | 10/2009 | Lee et al. | ............... | 362/84 |
| 2010/0002217 A1* | 1/2010 | Fiolka et al. | ............... | 355/67 |
| 2010/0277887 A1* | 11/2010 | Su et al. | ............... | 362/19 |

\* cited by examiner

Regular LED beam pattern

LED + 1 layer of 90 deg film with index of 1.50 and 1.90

LED + 1 layer of 90 deg film with index of 1.50 and 1.90

LED + 1 layer of 90 deg ridge film and 2D diamond cone film with index of 1.50

LED + 1 layer of 90 deg ridge film and 2D diamond cone film with index of 1.50

LED + 1 layer of 90 deg film with index of 1.50 and two layer of film both 1.50 index LED + 1 layer of 90 deg film with index of 1.50 and two layer of film both 1.50 index

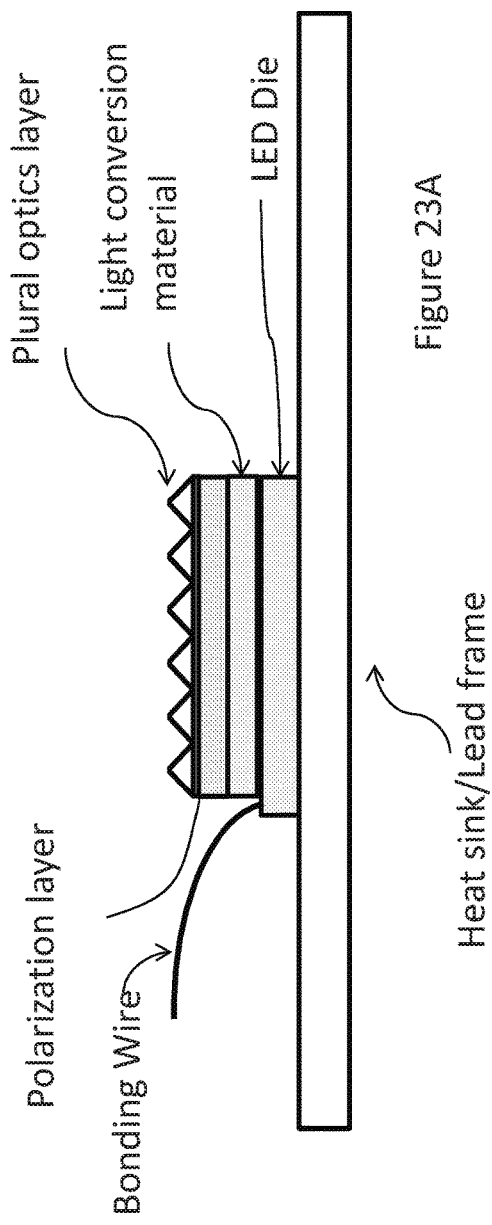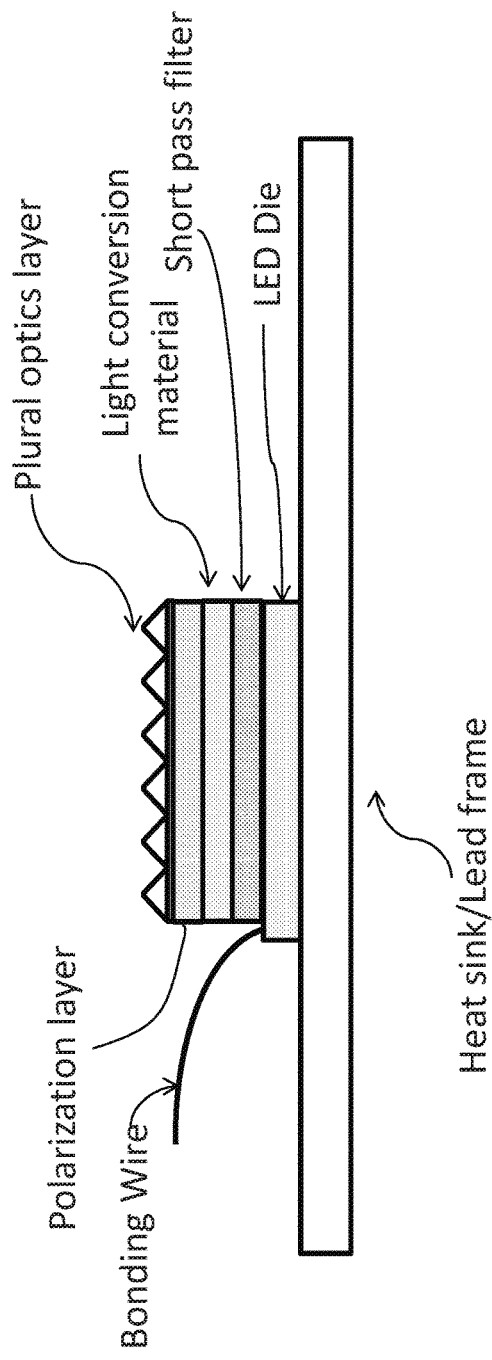

OPTICAL BEAM SHAPING AND POLARIZATION SELECTION ON LED WITH WAVELENGTH CONVERSION

PRIORITY CLAIM AND RELATED APPLICATIONS

This application is a 35 USC §371 National Stage application of, and claims priority of, International Application No. PCT/US2011/042251 filed Jun. 28, 2011, which further claims the benefit of priority to U.S. Provisional Application No. 61/398,510 entitled "OPTICAL BEAM SHAPING AND POLARIZATION SELECTION ON LED WITH WAVELENGTH CONVERSION MATERIAL" filed Jun. 28, 2010, the disclosure of which is incorporated by reference as part of the specification of this document.

BACKGROUND

LED devices having phosphor materials for converting LED light to desired wavelengths can be configured in various packages. For example, white LED devices may be used to replace some conventional light sources such as incandescent light bulbs, florescent light sources and discharge lamps. As shown in FIG. 1, a white LED device can include a short wavelength LED (Blue or UV) with a wavelength conversion material such as phosphors located in the LED light path to convert the LED light into white light. To further improve light extraction efficiency and shape the output light distribution, additional optics is placed around LED and phosphors base. As shown in FIG. 1, some commercial white LED devices include certain optics such as reflective cups and dome lens in various shapes to modify the emitted white light for output. The packaging of such commercial white LED devices tends to be bulky and requires complicated manufacturing processes.

SUMMARY

Techniques, devices and materials for light source devices convert excitation light into different light via wavelength conversion materials. One example of a light source includes an excitation light source; a wavelength conversion material that absorbs light from the excitation light source and emits a longer wavelength light; and a layer of a transparent material that has plural optical structures in contact to or in close proximity to the wavelength conversion material to receive the emitted light from the wavelength conversion material and to modify the received light to produce output light with a desired spatial pattern associated with the plural optical structures.

Light emitting devices with controllable light emitting distribution and improved extraction efficiency are provided. The light emitting device could be light emitting diode (LED) with wavelength conversion material such as phosphors. The light emitting device's improvement is achieved by a coating of thin layer of transparent material with defined geometric structure on the wavelength conversion material. The advantages of this approach are its compactness, material saving and Etendue reservation or improvement.

In one embodiment, the thin layer of wavelength conversion material is deposited on LED die surface. Then, a thin layer of transparent material is coated or attached on the wavelength conversion material with plural optical structures on the surface away from the interface between wavelength conversion material and the thin transparent layer. A thin layer of air gap (<¼th of the LED size) is between wavelength conversion material and transparent layer with plural optical structure.

In another embodiment, the thin layer of the wavelength conversion material with defined optical structure on its top is bonded to LED die through a high index of transparent material with index of refraction higher than 1.5 up to 2.0.

In another embodiment, the thin layer of wavelength conversion material is separated from the exciting light source (such as LED or laser). The wavelength conversion material is deposited on a short pass filter that passes the exciting light (from LED or laser) but reflecting longer wavelength light. On the other side of wavelength conversion material, a thin layer of transparent material with defined geometrical structure is coated or attached with thin air gap.

These and other features are described in detail in the drawings, the description and the claims.

BRIEF DESCRIPTION OF THE DRAWINGS

FIGS. 2-23 show various features of light sources described in this document.

DETAILED DESCRIPTION

Light sources can be used to produce pump light to pump one or more light conversion materials such as phosphors or quantum dots that produce light different from the pump light. For example, UV or blue light can be converted into visible light by phosphor materials that absorb the UV or blue light. Suitable excitation light sources can be light-emitting diodes (LEDs), semiconductor laser diodes (LDs) or other compact light sources that are driven by electrical control signals to emit light.

Various light devices are described to include one or more micro structured films used in combination with light sources and or phosphors film to produce desirable output light beam patterns. Examples below use LEDs as excitation light sources to illustrate various features. These features can be implemented with excitation light sources other than LEDs, such as LDs.

Figure 1:
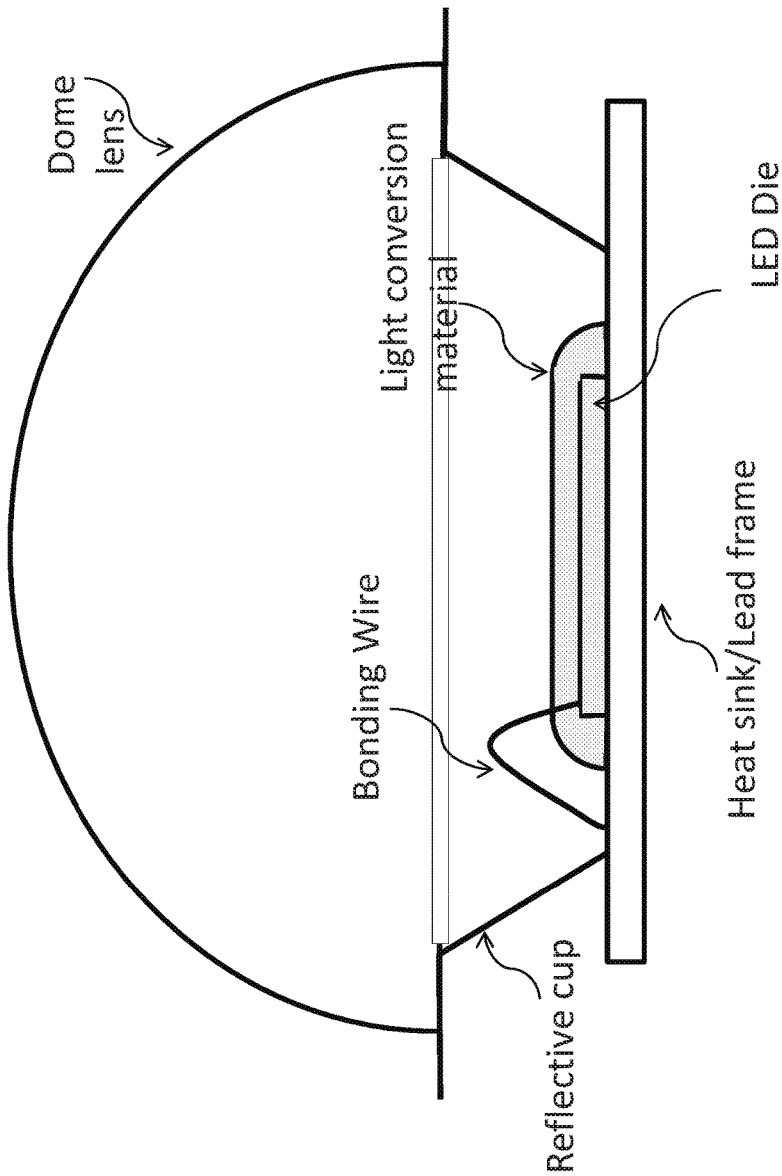
FIG. 1 shows an example of an LED device that converts LED light into different light via a phosphor material.
Figure 2:
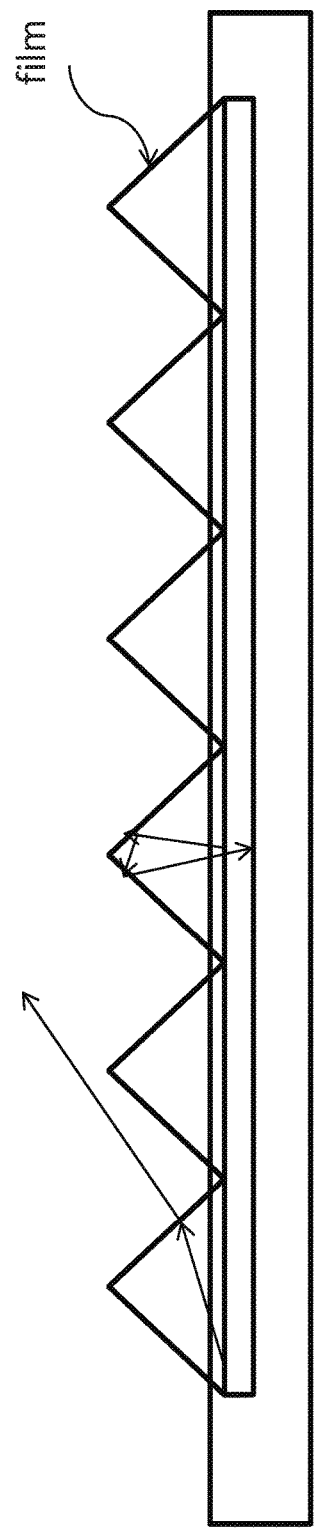

FIG. 2 illustrates an example of a microstructure film with a 90 degree ridge structure. Light traces are shown in the figure to illustrate light rays going through the film. The deflection effect of the film is illustrated here. A part of the light is deflected back to the incoming direction of the light. These deflected lights interact with LED source or phosphors film can create different light output patterns.

Figure 3:
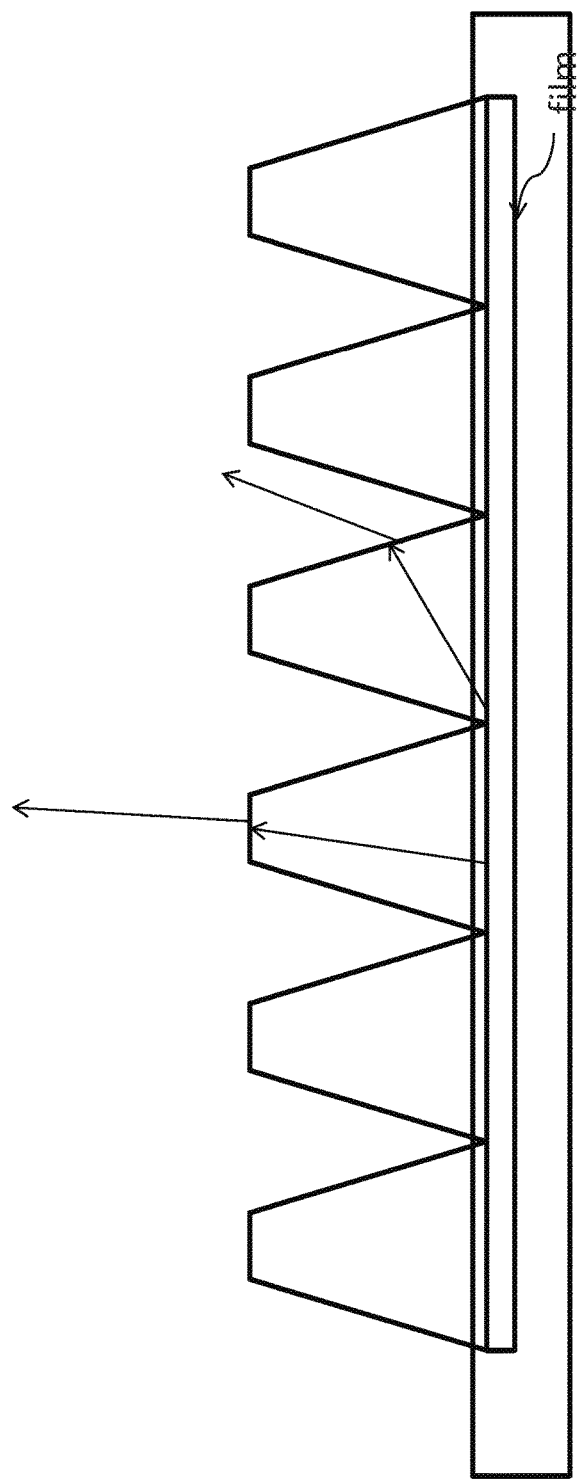
Figure 4:
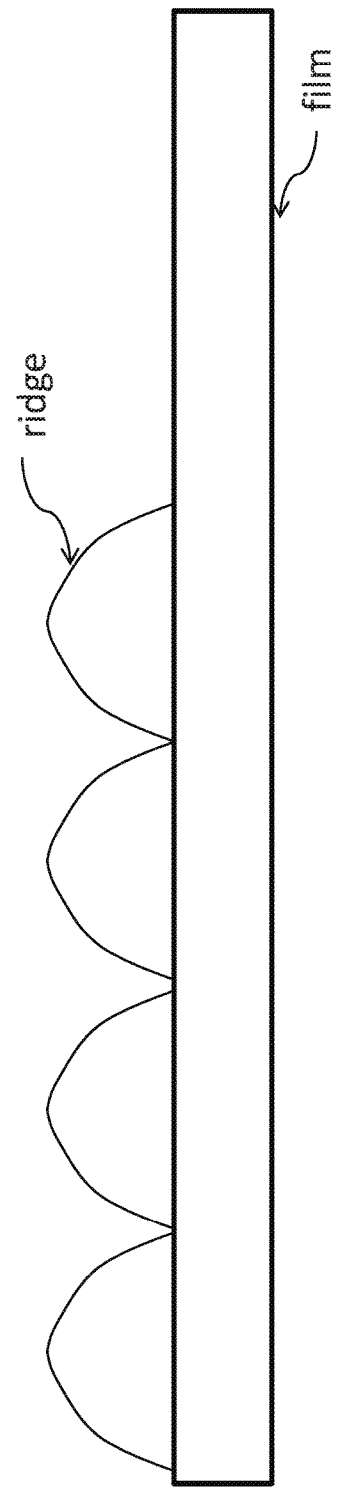
Figure 5:
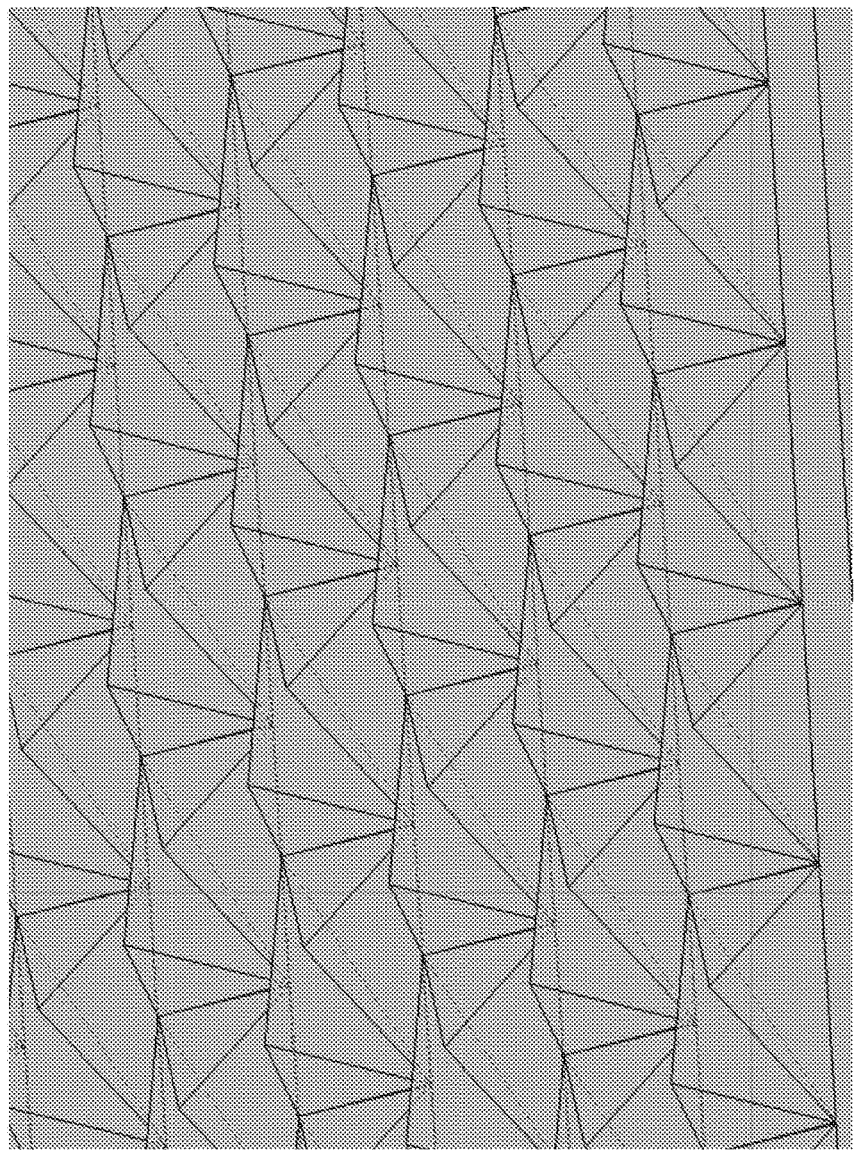
Figure 6:
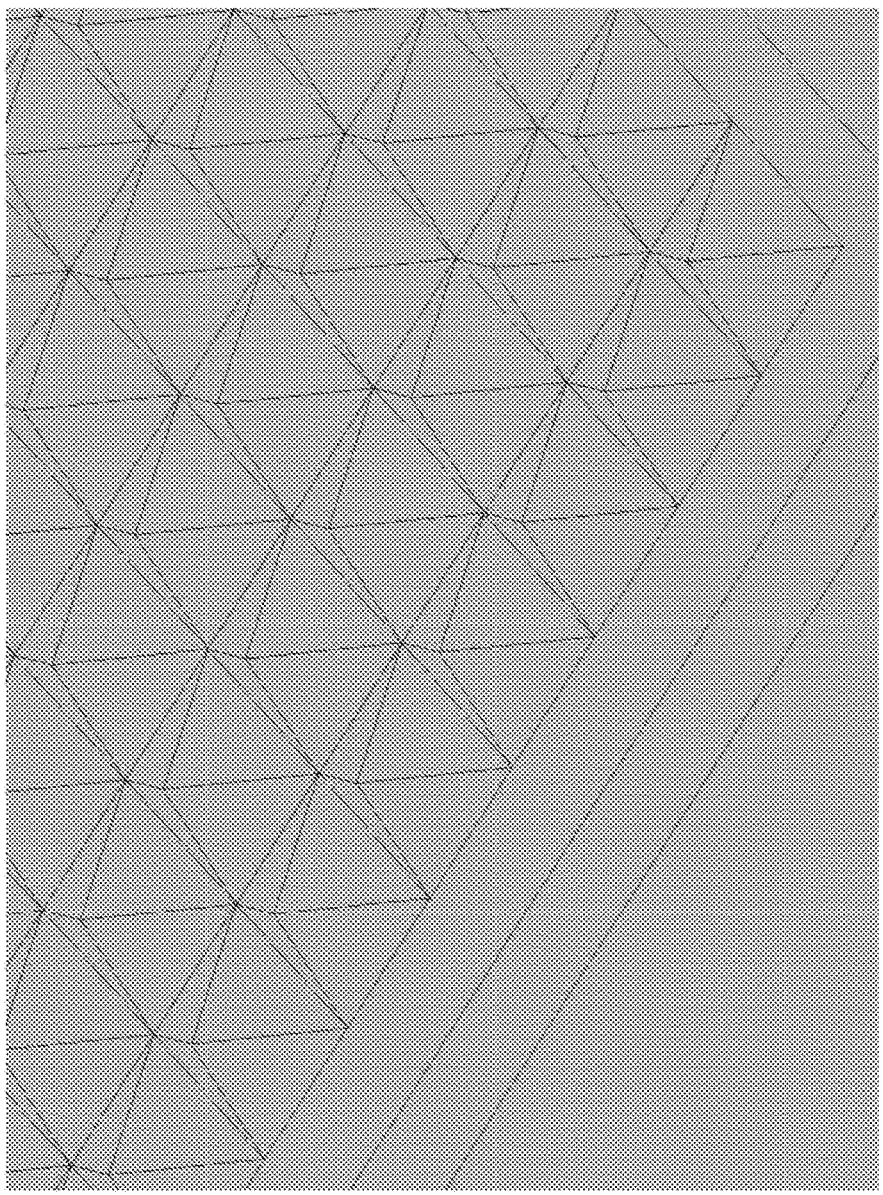
Figure 7:
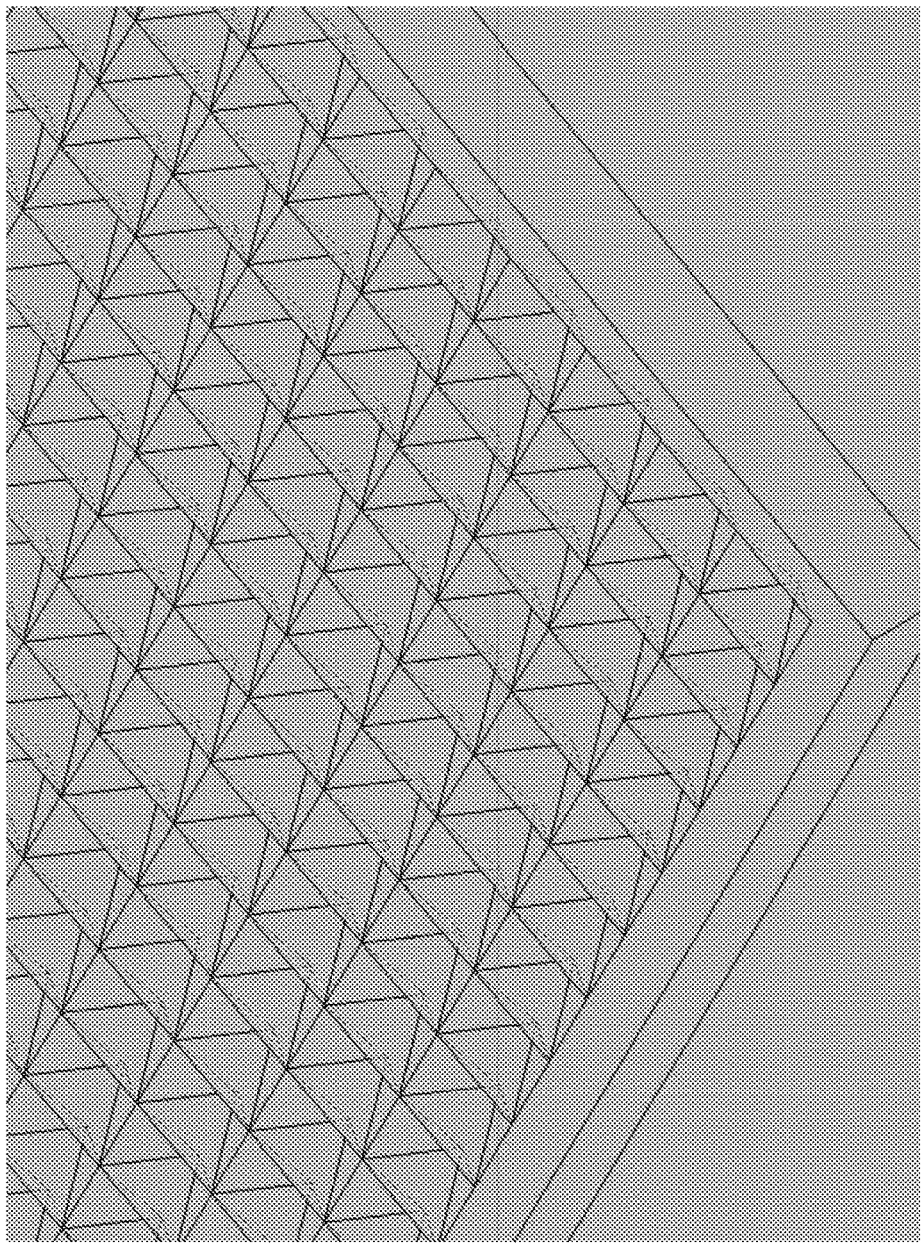
Figure 8:
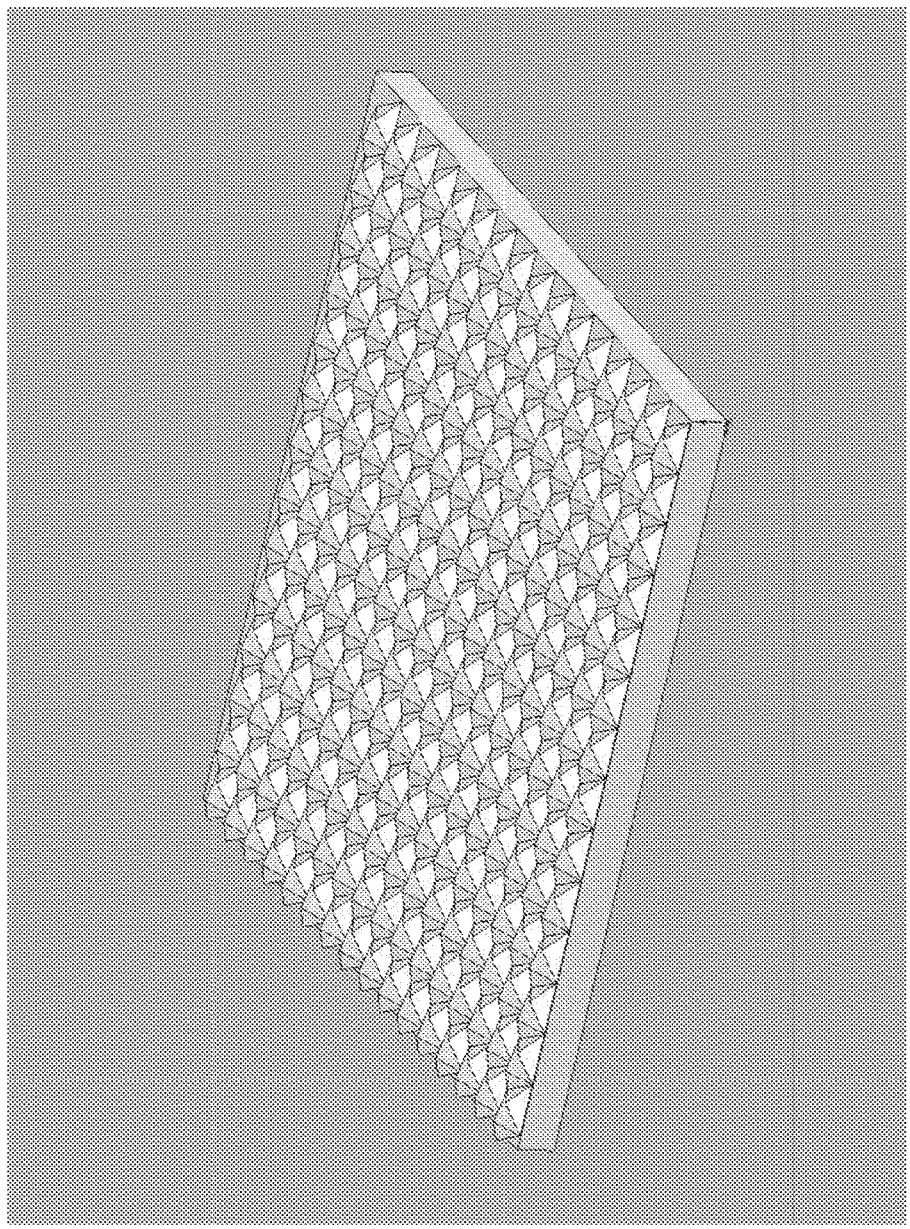
Figure 9:
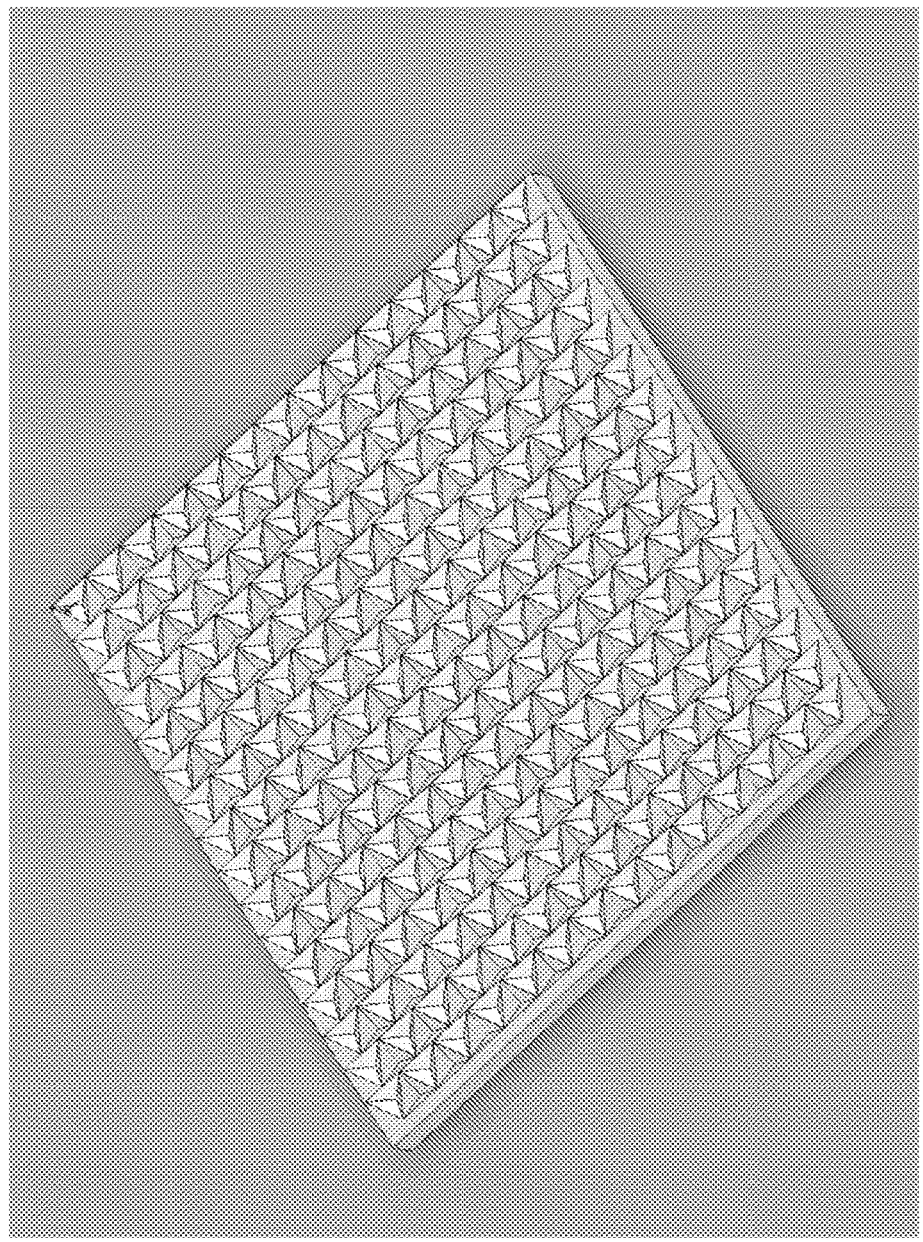

FIGS. 3 and 4 illustrate other different patterns of microstructures for the deflection film design. In some implementations, a microstructure can be in the dimension of 1 micron to 1000 microns, the thickness of these films can be between 2 microns to 2000 microns. These structures can be made of transparent materials, such as glass, epoxy, or polymers.

FIGS. 5, 6, 7, 8 and 9 illustrate different microstructure designs that are 2 dimension convex and concave diamonded cone structures. These microstructures can be in the dimension of 1 micron to 1000 microns in some implementations. These structures can be made of transparent materials, such as glass, epoxy, or polymers.

Figure 10:
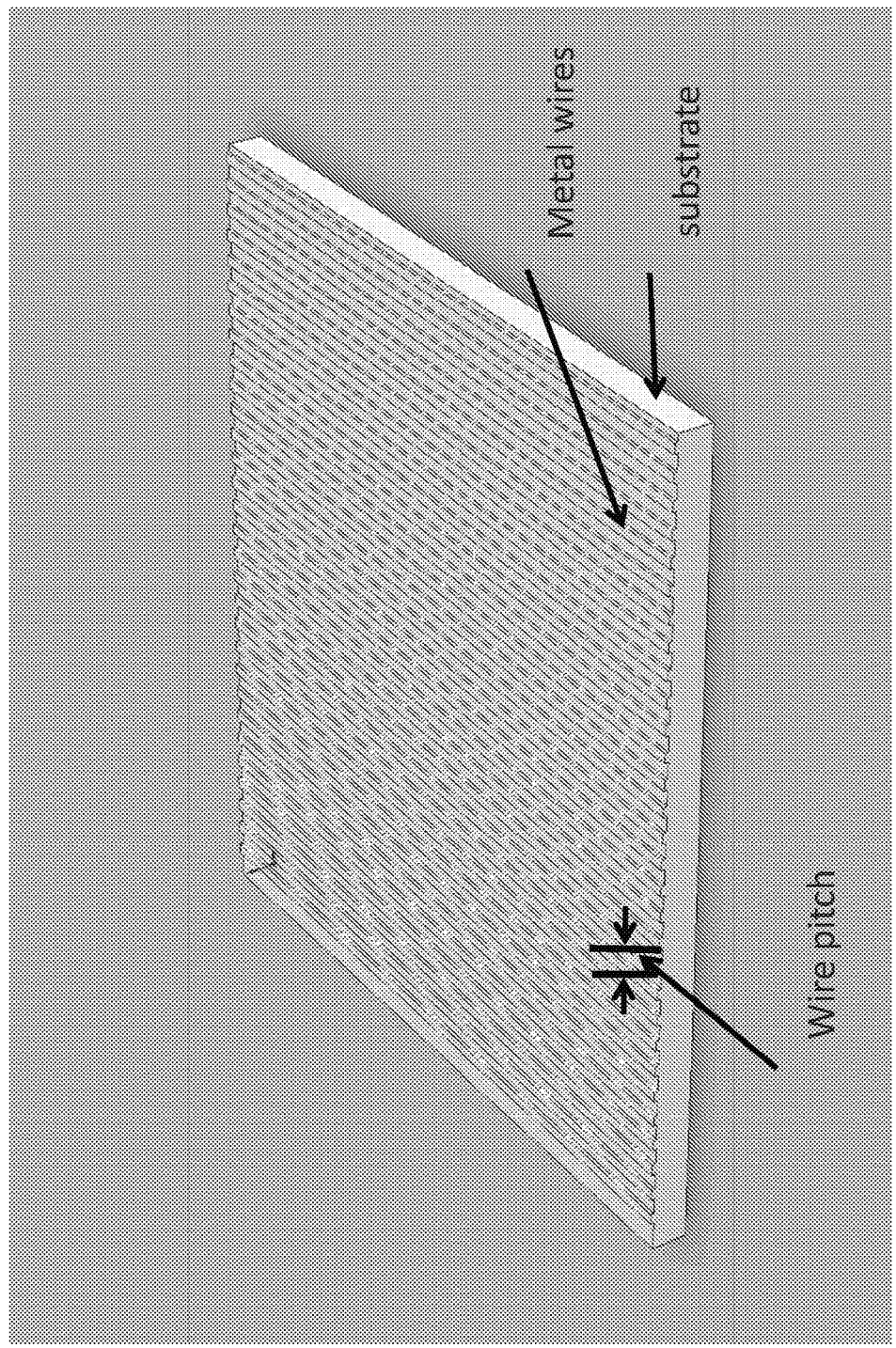

FIG. 10 illustrates a microstructure design made of an array of nano dimensioned metal wires. In this example, the nano wires are parallel to one another and are evenly spaced. The dimension of the nano wires is in the 10 nano meter to 200 nano meters, with a pitch of 20 nanometers to 1000 nanometers. These nano wires can be made on a transparent substrate, such as a glass or polymer film. This nano metal wire array can selectively transmit one type of polarization, and reflect another type of polarization which is orthogonal to the transmitted polarization.

Figure 11:
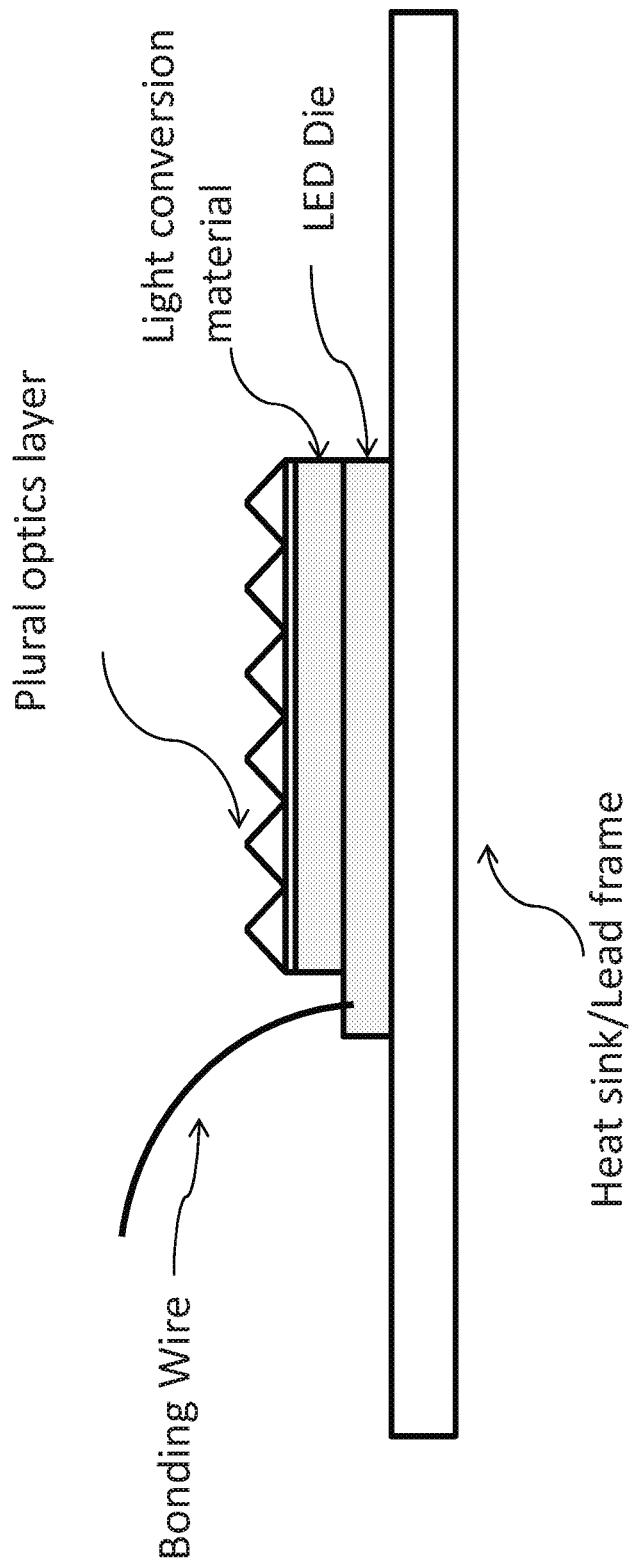

FIG. 11 illustrates an example of a LED device that includes a microstructure film formed over a LED and a light conversion material formed over the LED and below the film. The light conversion material can include a layer of photo phosphors which may be directly deposited on the LED or may be placed on or attached to the LED as a layer of a pre-formed film. This structure can be used for white LED light devices where the light conversion material converts the LED light into white light. On the top of the structure of the LED and the light conversion material layer, a layer of a light deflection film with microstructures is formed. Photons emitted from the LED and Photons emitted at the phosphors layer due to absorption of LED light interact with the top deflection film and bounce back and forth within the structure to create a light shaping effect where light bounces between the LED and the light deflection film and exits the top deflection film in selected directions that are defined by the microstructures in the deflection film. The deflection film can also effectuate a light focusing effect on the light coming out of the deflection film and the light focusing can depend on the optical index of refraction of the deflection film. The geometry of the deflection film can also affect the light focusing.

Figure 12:
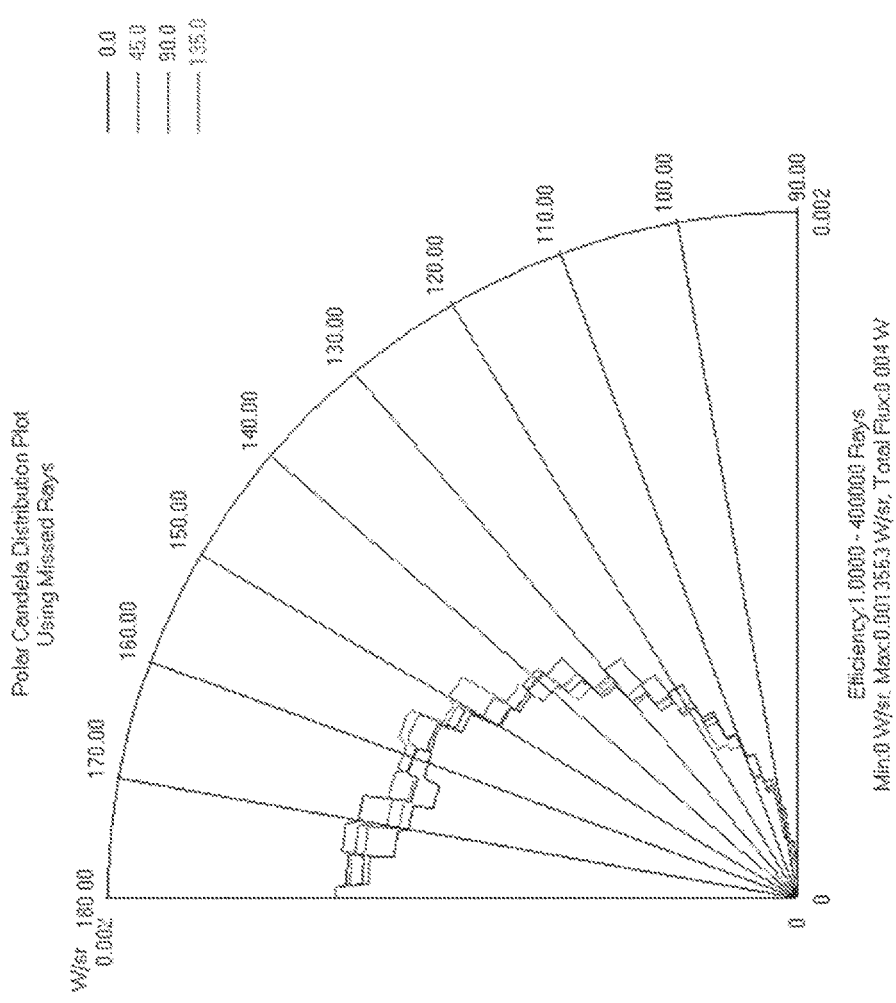

FIG. 12 shows a light beam output pattern of photo phosphors under illumination of a LED light. The light beam output pattern exhibits a classical Lambertian distribution.

Figure 13A:
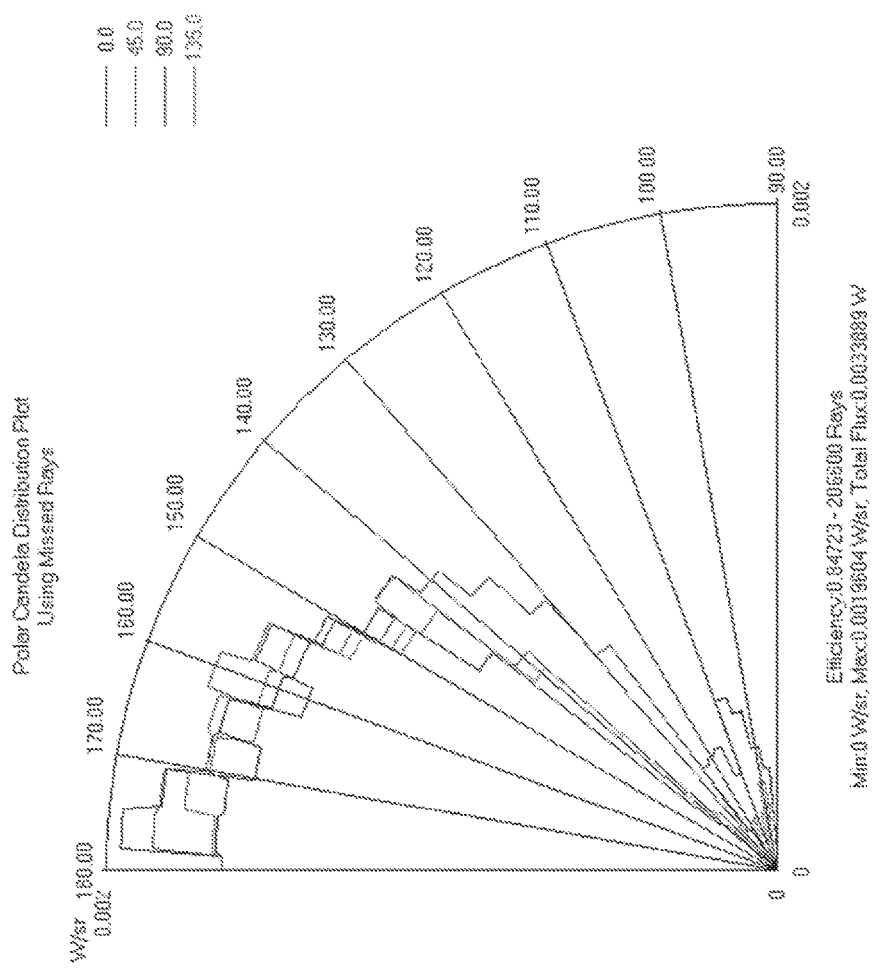

FIG. 13A shows a light beam output pattern with a layer of deflection film having a 1-dimension 90-degree angle ridge array micro structures with an optical transparent material having an optical index of refraction of 1.50. The focus effect of the film on the light beam is shown.

Figure 13B:
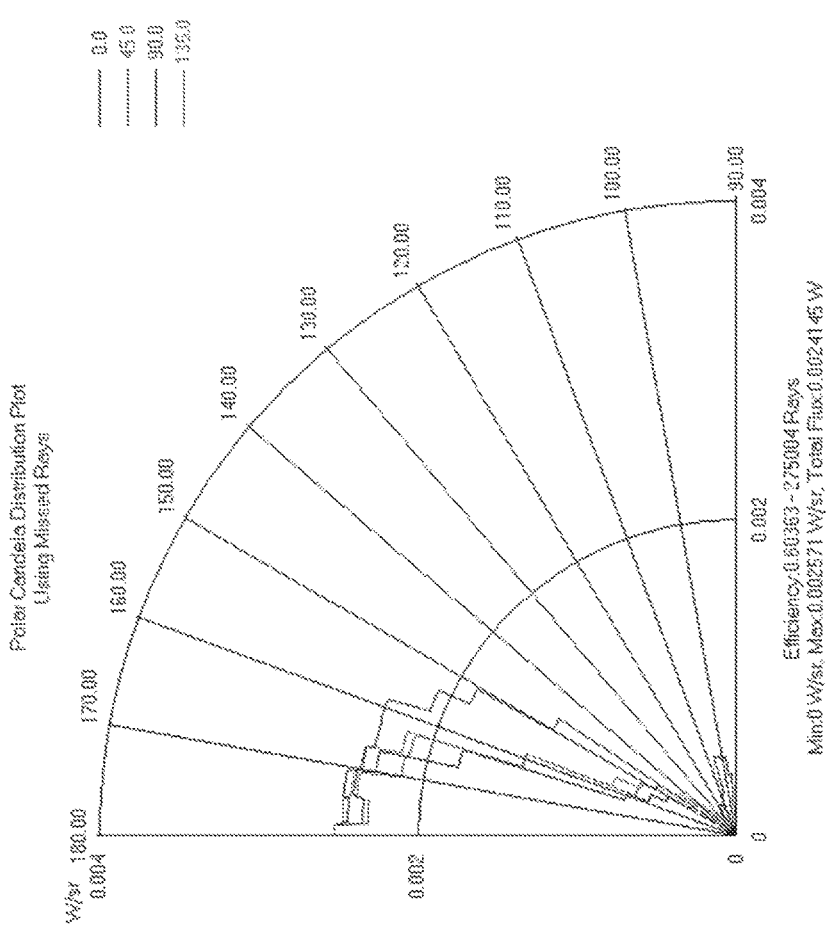

FIG. 13B shows a light beam output pattern with a layer of a deflection film having a 1-dimension 90-degree angle ridge array micro structures with an optical transparent material having an optical index of refraction of 1.90. This increased refractive index leads increases the focusing effect.

Figure 14A:
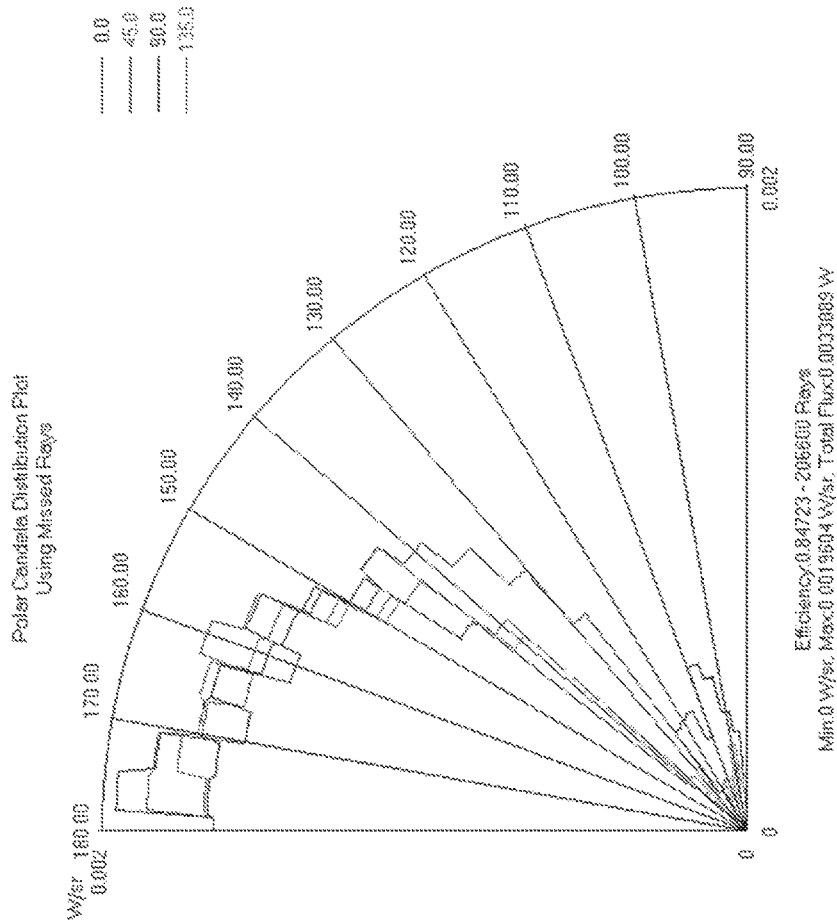
Figure 14B:
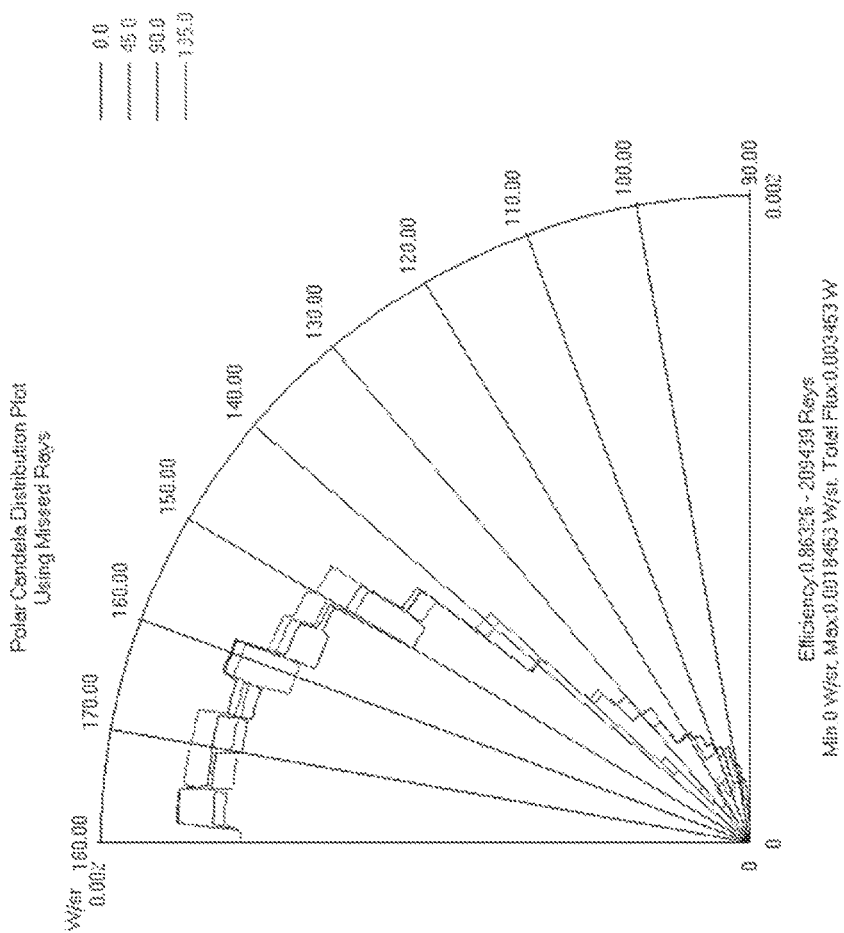

FIGS. 14A and 14B illustrate different light shaping effects of one dimension ridge (A) and two dimension diamond cone (B) micro structures.

Figure 15:
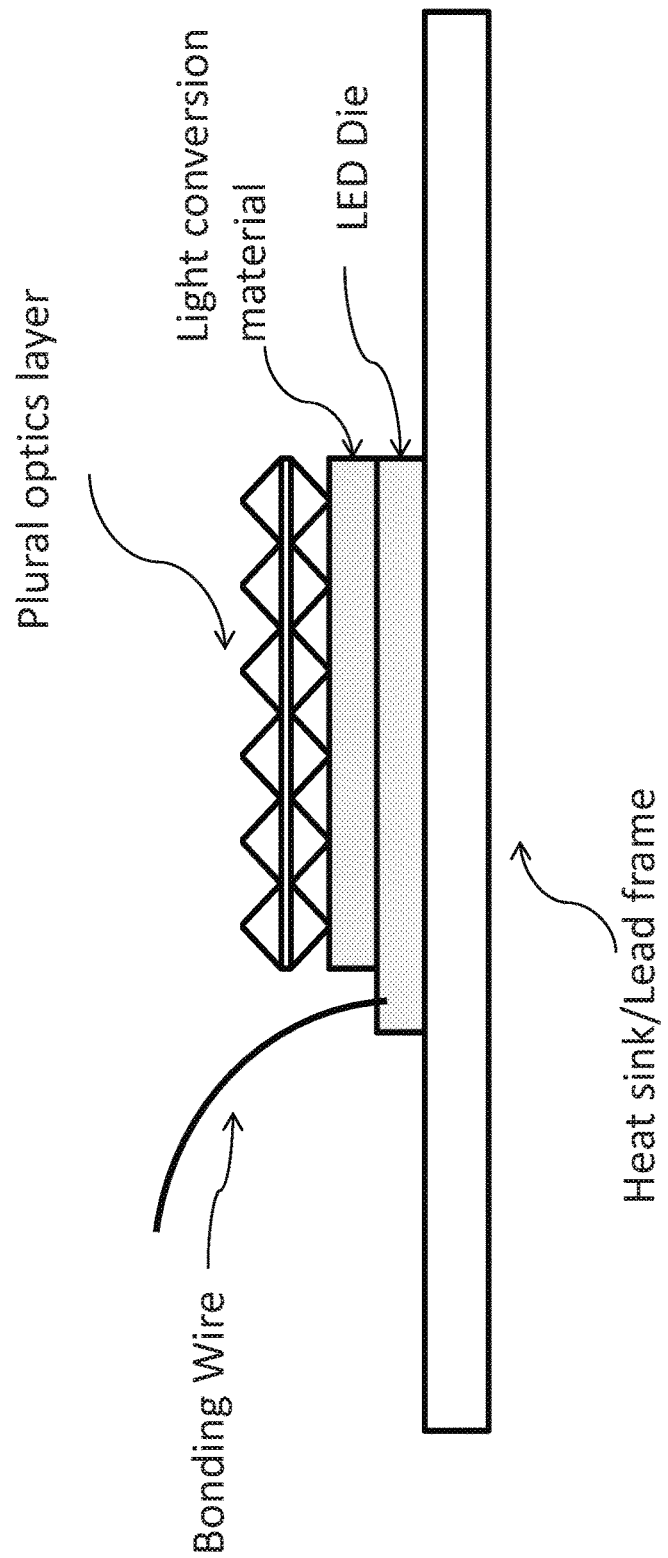

FIG. 15 illustrates another example of a LED device that includes a microstructure layer formed over a LED and a light conversion material formed over the LED and below the microstructure layer. The microstructure layer includes two layers of deflection micro structured films.

Figure 16A:
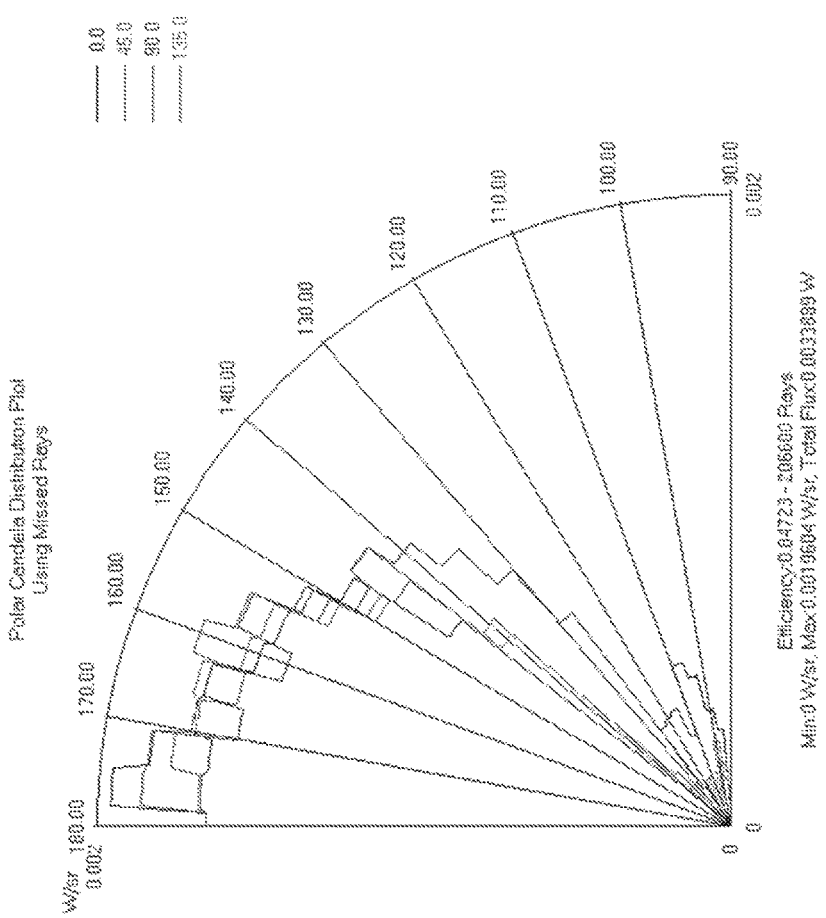
Figure 16B:
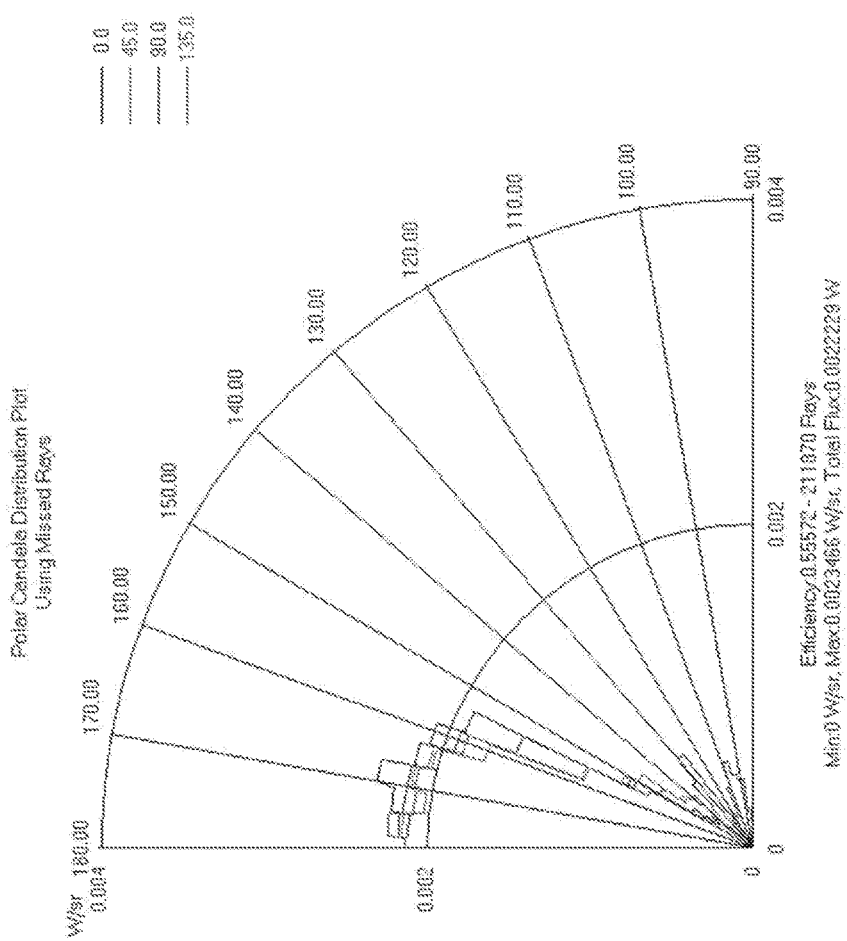

FIGS. 16A and 16B show light output patterns of two LED devices with one layer of the film (A), and with two layers of the films (B), respectively. In comparison, a stronger focus effect is shown in the LED device having the two layers of films.

Figure 17:
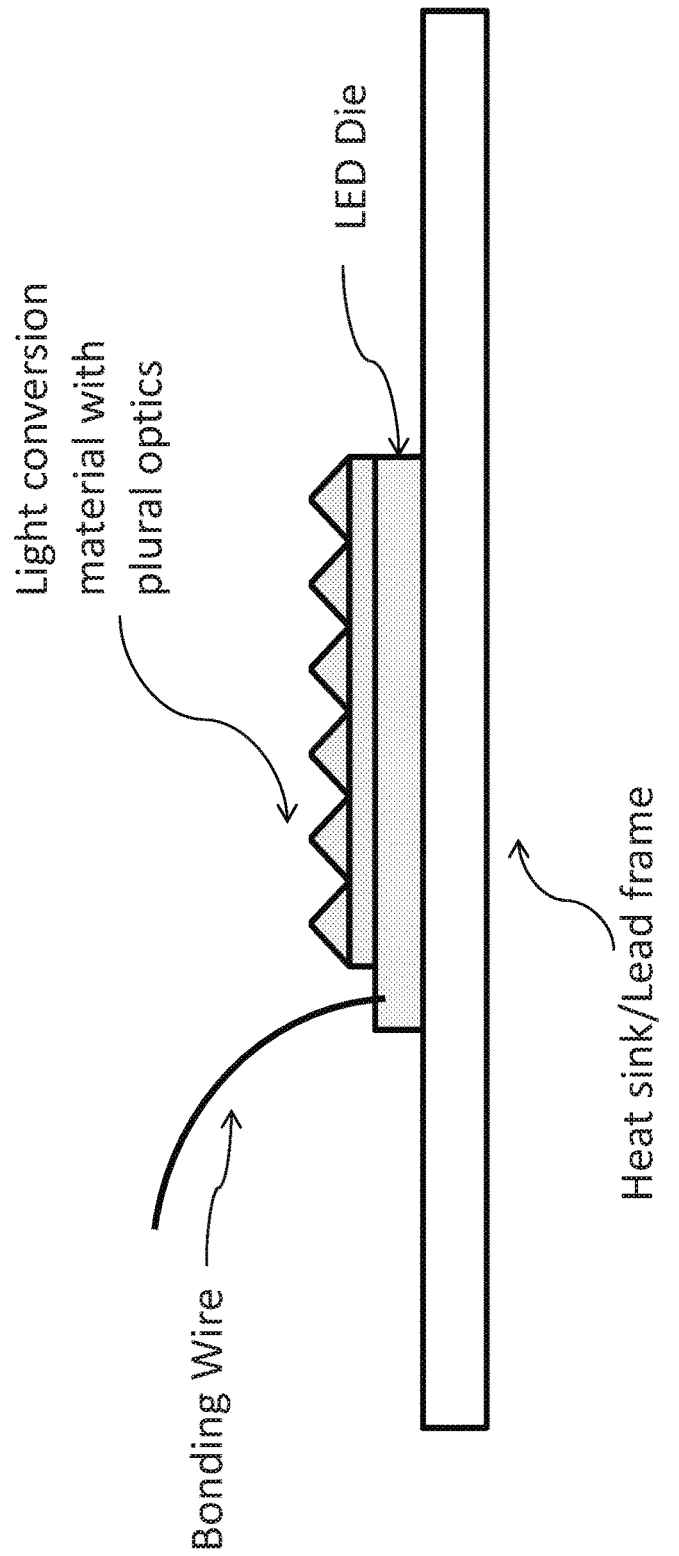

FIG. 17 illustrates a LED device that includes a microstructure layer and a light conversion material that are mixed together where a photo phosphor material is mixed in the material of the deflection film.

Figure 18:
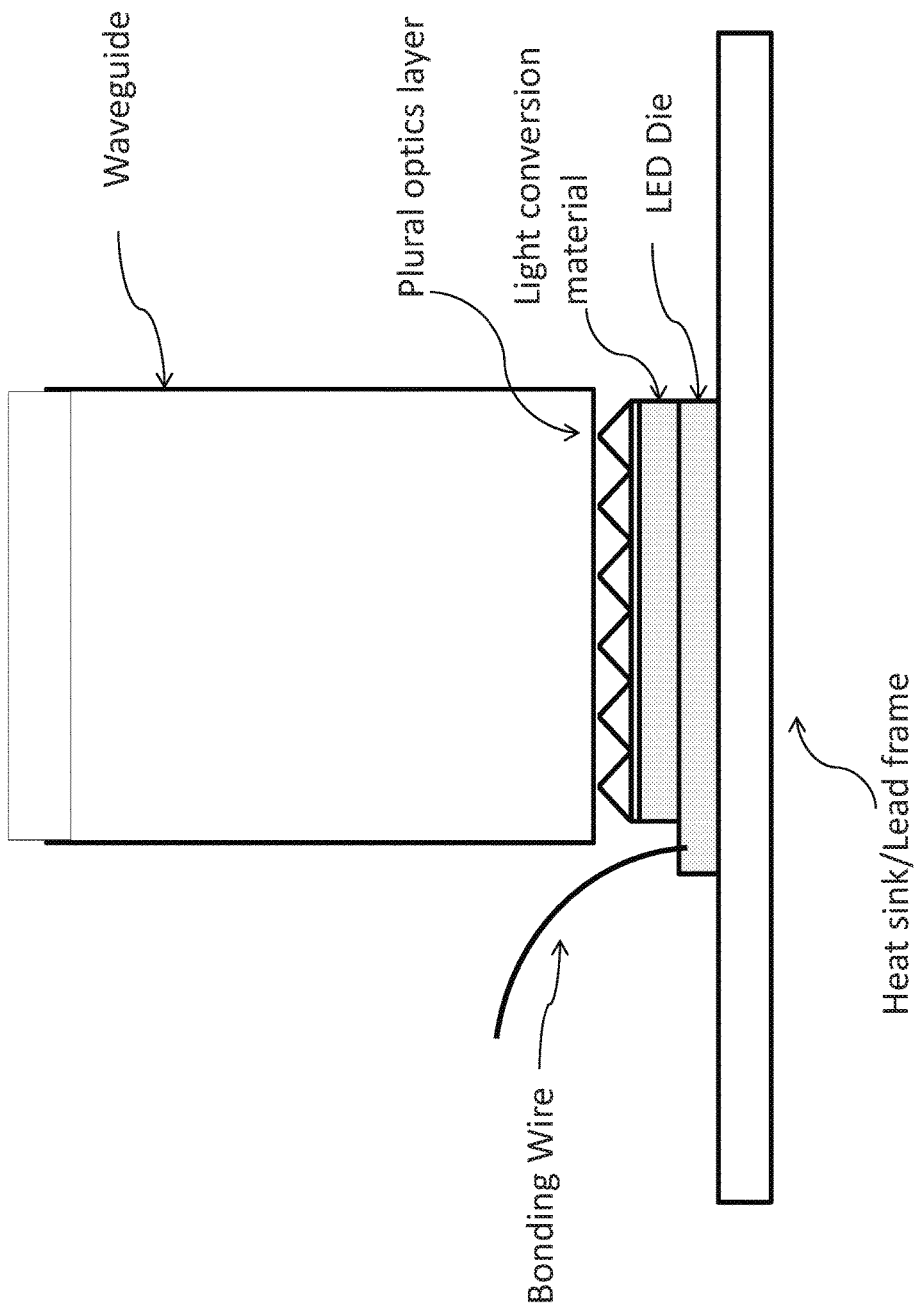

FIG. 18 illustrates a LED device where a micro structure film is used in junction of a light guide or waveguide located on top of the film to collect and receive light output by the film. This structure allows more light to be collected into the light guide because of the micro structure film focus effect.

Figure 19:
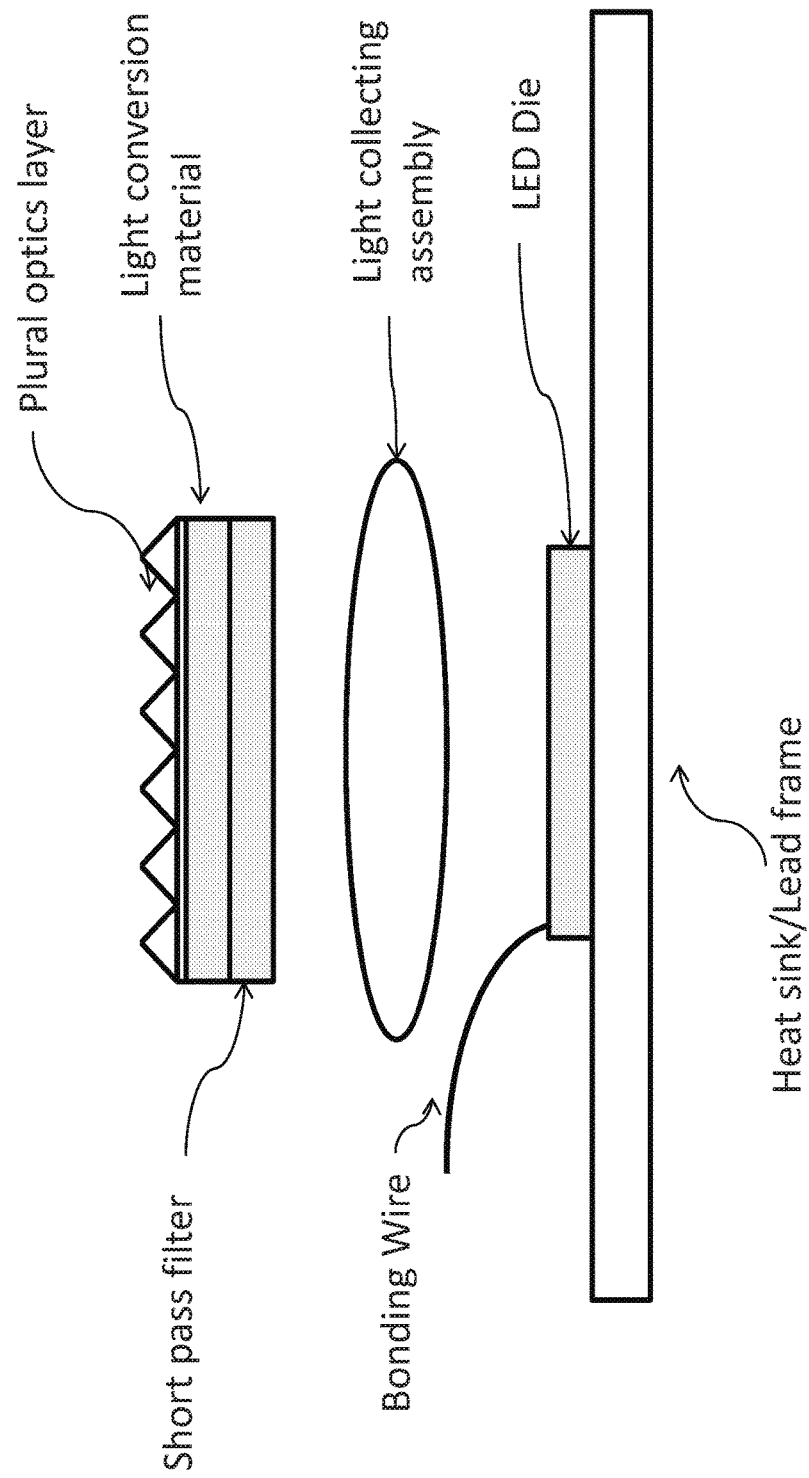

FIG. 19 illustrates a LED device where a remote phosphor film that is located away from the LED die is used to perform the light conversion. A light collecting assembly (e.g., one or more lenses) is placed in the space between the LED die and the phosphor film to direct LED light to the phosphor film. A micro structure film is formed on top of the phosphor film to shape the light beam output by the phosphor film under the excitation of the LED light. A short pass filter that transmits light of short wavelengths (e.g., UV or blue light) and blocks light of long wavelengths (e.g., visible light) is placed between the phosphor film and the light collecting assembly.

Figure 20:
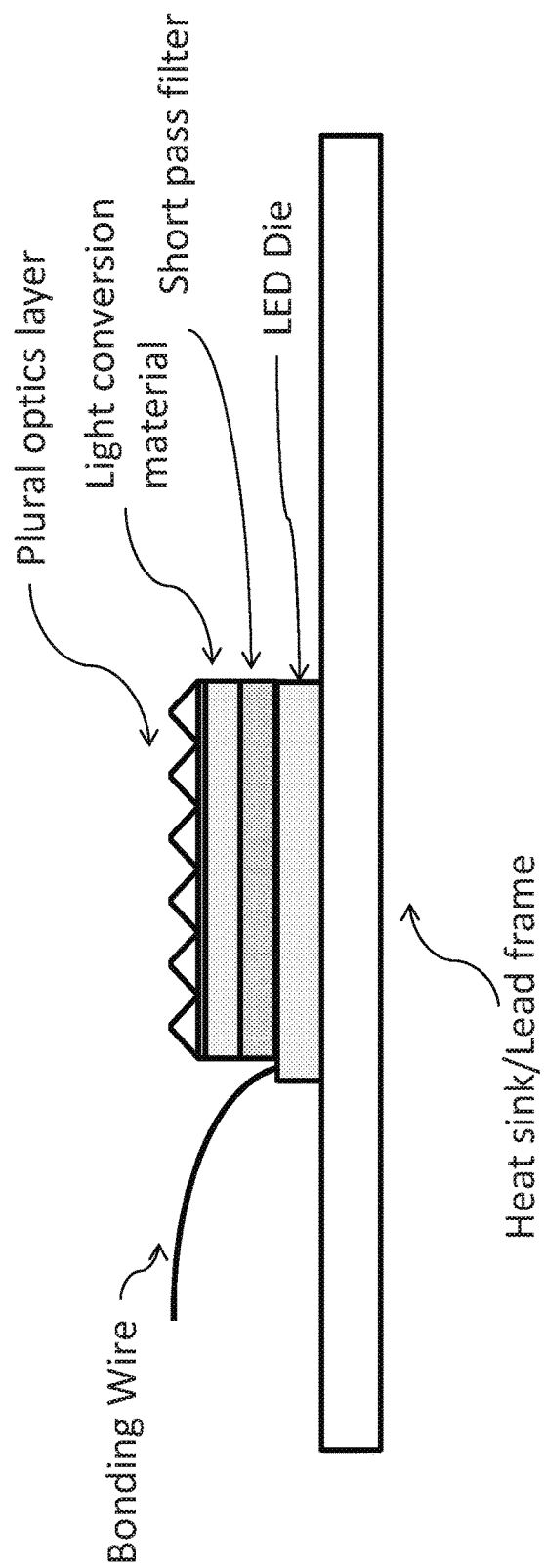

FIG. 20 illustrates a LED device where a short pass optical filter is placed between the light conversion material and the LED, and a micro structure film is used on top of light conversion layer. The short pass optical film in combination with micro structure film, can further improve the light beam shape.

Figure 21:
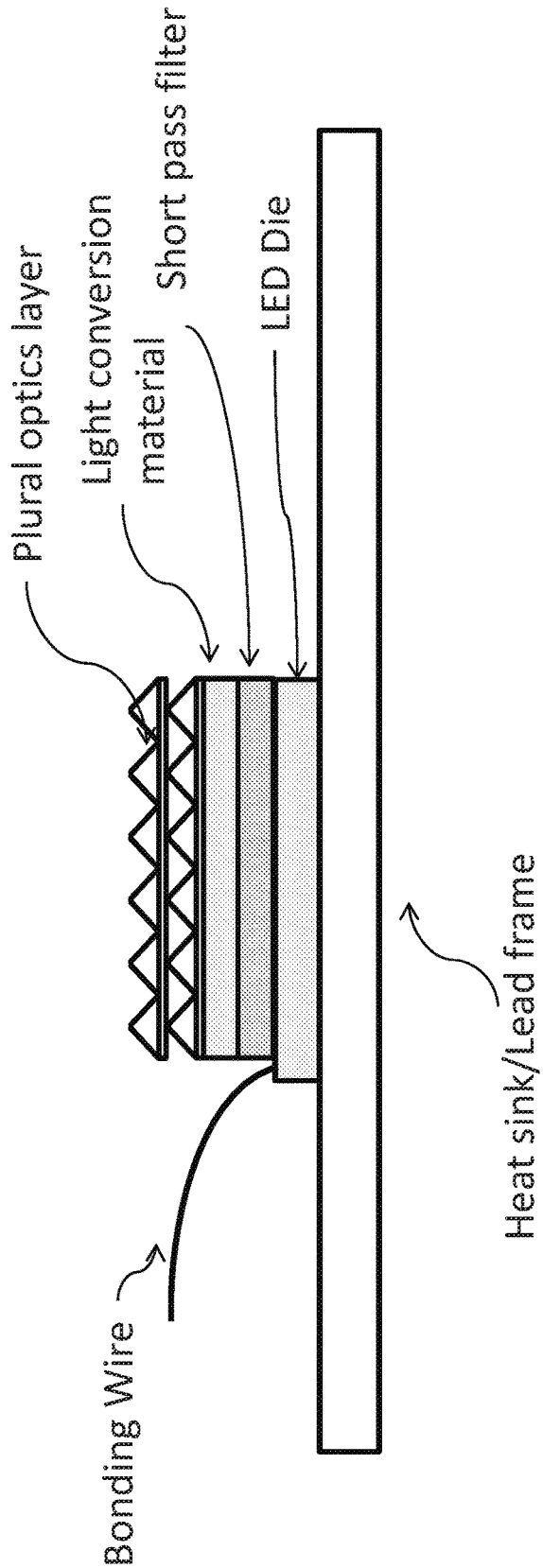

FIG. 21 illustrates a LED device that is similar to FIG. 20 but has a two-layer micro structure film rather than the single layer microstructure film.

Figure 22:
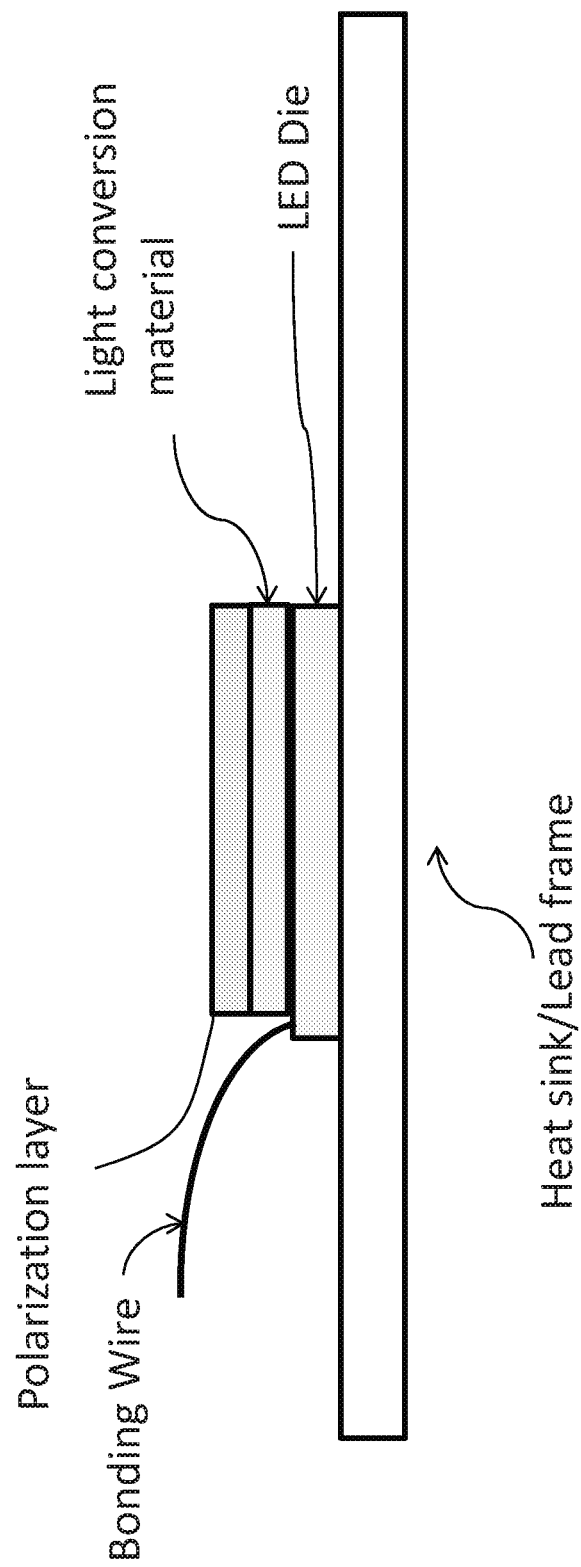

FIG. 22 illustrates a LED device where on top of the light conversion layer, a nano wire array film is used to select one type of polarization to pass through, and other polarization beam reflect back to the conversion layer. This design creates a light beam pattern with strong component in one type of polarization.

FIGS. 23A and 23B illustrate LED devices where based on design from FIG. 22, a micro structured film is used for shaping the light beam output pattern (A), and both short pass filter and micro structure film are used to shape the light beam output pattern (B).

Only some implementations of light device designs are described. Enhancements and variations of the described implementations and other implementations can be made based on what is described and illustrated.

What is claimed is:

1. A light source, comprising:
   an excitation light source;
   a wavelength conversion material that absorbs light from the excitation light source and emits a longer wavelength light;
   a microstructure film in contact to or in close proximity to the wavelength conversion material to receive light emitted from the wavelength conversion material and to modify the light emitted from the wavelength conversion material to produce output light with a desired spatial pattern, wherein the microstructure film comprises plural optical structures on a transparent material and the plural optical structures define the desired spatial pattern for the output light; and
   a second microstructure film in contact to or in close proximity to the microstructure film.

2. The light source in claim 1, wherein the excitation light source includes one or multiple light emitting diodes (LEDs).

3. The light source in claim 1, wherein the excitation light source includes one or multiple lasers diodes (LDs).

4. The light source in claim 1, wherein the wavelength conversion material includes phosphors.

5. The light source in claim 1, wherein the wavelength conversion material includes quantum dots.

6. The light source in claim 1, wherein the excitation light source includes an LED formed on an LED die and the wavelength conversion material is optically bonded to the LED die by a high index material having an index of refraction higher than 1.4 and less than 2.4.

7. The light source in claim 1, wherein the microstructure film has a size equal to or slightly larger than a size of the wavelength conversion material, and each of the plural optical structures has a base and an apex that is smaller than the base.

8. The light source in claim 1, wherein each of the plural optical structures has a base that has at least one dimension larger than 1 µm but smaller than ¼th of a size of the wavelength conversion material.

9. The light source in claim 1, wherein the microstructure film is optically bonded to the wavelength conversion material.

10. The light source in claim 1, wherein the microstructure film is engaged to the wavelength conversion material through an index matching gel/epoxy.

11. The light source in claim 1, wherein the excitation light source includes an LED formed on an LED die and the layer of microstructure film is in close proximity to the wavelength conversion material with an air gap that is smaller than ¼th size of the LED die.

12. The light source in claim 1, wherein the microstructure film comprises the plural optical structures on both sides of the transparent material.

13. The light source in claim 1, wherein the microstructure film comprises the plural optical structures on both sides of the transparent material and orientations of the plural optical structures on both sides are configured to be identical or different including orthogonal.

14. The light source in claim 1, wherein the plural optical structures are identical or different.

15. The light source in claim 1, further comprising light collecting optics collecting majority of the output light (>55%).

16. The light source in claim 15, wherein the light collecting optics is an optical waveguide with similar optical input acceptance angle to the emission angle from the transparent layer with plural optical structure (within 75%).

17. The light source in claim 16, wherein the excitation light source includes an LED formed on an LED die and the optical waveguide input dimension is no less than 60% of the LED die dimension.

18. The light source in claim 1, wherein each of the plural optical structures is in the dimension of 1 micron to 1000 microns.

19. The light source in claim 1, wherein thickness of the layer of microstructure film can be between 2 microns to 2000 microns.

20. The light source in claim 1, wherein the layer of microstructure film can be made of glass, epoxy, or polymers.

21. A light source comprising:
an excitation light source;
a wavelength conversion material that absorbs light from the excitation light source and emits longer wavelength light;
a layer of microstructure film in contact to or in close proximity to the wavelength conversion material-to receive light emitted from the wavelength conversion material and to shape the light emitted from the wavelength conversion material to produce output light with a desired spatial pattern, wherein the layer of microstructure film comprises plural optical structures on a transparent material and the plural optical structures define the desired spatial pattern for the output light;
a light collecting optical assembly that collects light from the excitation light source and delivers the light onto the wavelength conversion material; and
a color filter that pass the light from excitation light source but reflects the longer wavelength light emitted from the wavelength extension material, the color filter being located near the wavelength conversion material and between the light collecting optics and the wavelength conversion material;
wherein the light collecting optical assembly is disposed between the excitation light source and the wavelength conversion material.

22. The light source in claim 21, wherein the light excitation source is a single LED or LD.

23. The light source in claim 21, wherein the light excitation source includes multiple LEDs or LDs and the light collecting optics is a focusing optics device that combines multiple LED light output and condenses the light onto the light conversion material.

24. The light source in claim 21, wherein each of the plural optical structures is in the dimension of 1 micron to 1000 microns.

25. The light source in claim 21, wherein thickness of the layer of microstructure film can be between 2 microns to 2000 microns.

26. The light source in claim 21, wherein the layer of microstructure film can be made of glass, epoxy, or polymers.

27. A light source, comprising:
an excitation light source;
a wavelength conversion material that absorbs light from the excitation light source and emits a longer wavelength light; and
a microstructure film in contact to or in close proximity to the wavelength conversion material to receive light emitted from the wavelength conversion material and to modify the light emitted from the wavelength conversion material to produce output light with a desired spatial pattern, wherein the microstructure film comprises plural optical structures on a transparent material and the plural optical structures define the desired spatial pattern for the output light,
wherein the microstructure film includes periodic structures on both sides of the transparent material arranged to have opposing orientations or a common orientation.

28. A light source, comprising:
an excitation light source;
a wavelength conversion material that absorbs light from the excitation light source and emits a longer wavelength light; and
a layer of microstructure film in contact to or in close proximity to the wavelength conversion material to receive light emitted from the wavelength conversion material and to modify the light emitted from the wavelength conversion material to produce output light with a desired spatial pattern, wherein
the layer of microstructure film comprises multiple microstructures on a transparent material,
the multiple microstructures define the desired spatial pattern for the output light,
a subset of the multiple microstructures is arranged in one orientation, and
another subset of the multiple microstructures is arranged in a different orientation such that the subset and another subset of the multiple microstructures provide a symmetrical geometry over the excitation light source.

29. The light source in claim 28, wherein the multiple microstructures are on both sides of the transparent material.

* * * * *